United States Patent
Bayerer

(10) Patent No.: US 8,999,758 B2
(45) Date of Patent: Apr. 7, 2015

(54) FIXING SEMICONDUCTOR DIE IN DRY AND PRESSURE SUPPORTED ASSEMBLY PROCESSES

(75) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 714 days.

(21) Appl. No.: 13/208,893

(22) Filed: Aug. 12, 2011

(65) Prior Publication Data

US 2013/0040424 A1     Feb. 14, 2013

(51) Int. Cl.
  *H01L 21/00*    (2006.01)
  *H01L 21/673*   (2006.01)
  (Continued)

(52) U.S. Cl.
  CPC .... *H01L 21/67333* (2013.01); *H01L 21/67092* (2013.01); *H01L 21/68778* (2013.01); *H01L 21/68785* (2013.01); *H01L 24/75* (2013.01); *H01L 24/83* (2013.01); *H01L 24/97* (2013.01); *H01L 2224/83005* (2013.01); *H01L 24/29* (2013.01); *H01L 24/32* (2013.01); *H01L 2224/75315* (2013.01); *H01L 2224/83136* (2013.01); *H01L 2224/83191* (2013.01); *H01L 2224/83192* (2013.01); *H01L 2224/83193* (2013.01); *H01L 2224/83203* (2013.01);
  (Continued)

(58) Field of Classification Search
  USPC ............... 438/106, 107, 118, 119, 121, 125
  See application file for complete search history.

(56) References Cited

U.S. PATENT DOCUMENTS

| 4,903,885 A | 2/1990 | Schwarzbauer |
| 7,525,187 B2 | 4/2009 | Speckels et al. |

(Continued)

FOREIGN PATENT DOCUMENTS

| EP | 0242626 B1 | 10/1987 |
| EP | 0330895 B1 | 12/1994 |

(Continued)

OTHER PUBLICATIONS

Bayerer, Reinhold, "Higher Junction Temperature in Power Modules—a demand from hybrid cars, a potential for the next step increase in power density for various Variable Speed Drives", Power Conversion Intelligent Motion, May 27, 2008, Nuremberg, Germany.

(Continued)

*Primary Examiner* — Jarrett Stark
*Assistant Examiner* — John M Parker
(74) *Attorney, Agent, or Firm* — Murphy, Bilak & Homiller, PLLC

(57) ABSTRACT

Semiconductor die are assembled on a substrate by providing the semiconductor die, substrate, and an elastically deformable foil fixture preformed with one or more sunken regions having sidewalls and a bottom, and placing the semiconductor die in the one or more sunken regions so that the foil fixture is populated with a first side of the semiconductor die facing the bottom of the one or more sunken regions and a second opposing side of the semiconductor die facing away from the bottom of the one or more sunken regions. The substrate is placed adjacent the second side of the semiconductor die with a joining material interposed between the substrate and the semiconductor die. The substrate and the populated foil fixture are pressed together at an elevated temperature and pressure via first and second pressing tool members so that the substrate is attached to the second side of the semiconductor die via the joining material.

11 Claims, 9 Drawing Sheets

(51) Int. Cl.
*H01L 21/67* (2006.01)
*H01L 21/687* (2006.01)
*H01L 23/00* (2006.01)

(52) U.S. Cl.
CPC . *H01L2224/8382* (2013.01); *H01L 2224/8384* (2013.01); *H01L 2224/97* (2013.01); *H01L 2224/7598* (2013.01); *H01L 2224/83209* (2013.01); *H01L 2224/75987* (2013.01); *H01L 2224/32225* (2013.01)

(56) References Cited

U.S. PATENT DOCUMENTS

| | | | |
|---|---|---|---|
| 7,555,832 | B2 | 7/2009 | Guth et al. |
| 7,682,875 | B2 | 3/2010 | Guth et al. |
| 8,513,062 | B2 * | 8/2013 | Nikitin et al. ............ 438/119 |
| 2003/0027373 | A1 * | 2/2003 | DiStefano et al. ......... 438/106 |
| 2005/0224953 | A1 * | 10/2005 | Lee et al. ................. 257/704 |
| 2005/0247760 | A1 | 11/2005 | Palm |
| 2008/0230589 | A1 | 9/2008 | Guth et al. |
| 2008/0230905 | A1 | 9/2008 | Guth et al. |
| 2008/0251903 | A1 | 10/2008 | Otremba et al. |
| 2009/0206456 | A1 | 8/2009 | Guth et al. |
| 2009/0227071 | A1 * | 9/2009 | Otremba et al. ............ 438/113 |
| 2010/0062563 | A1 * | 3/2010 | Pressel et al. ............. 438/106 |
| 2010/0203676 | A1 * | 8/2010 | Theuss et al. ............. 438/109 |
| 2010/0210071 | A1 * | 8/2010 | Mahler et al. ............. 438/107 |
| 2011/0127675 | A1 * | 6/2011 | Ewe et al. ................. 257/773 |
| 2012/0313239 | A1 * | 12/2012 | Zohni .................... 257/737 |
| 2014/0021634 | A1 * | 1/2014 | Nikitin et al. ............. 257/774 |

FOREIGN PATENT DOCUMENTS

| | | |
|---|---|---|
| EP | 764978 A2 | 3/1997 |
| WO | 2010064342 A1 | 6/2010 |

OTHER PUBLICATIONS

Bayerer, Reinhold, "Advanced packaging yields higher performance and reliability in power electronics", Microelectronics Reliability, Sep.-Nov. 2010, pp. 1715-1719, vol. 50, issues 9-11.

Mertens, C. et al."Top-Side Chip Contacts with Low Temperature Joining Technique (LTJT)", 2004 35th Annual IEEE Power Electronics Specialists Conference, 2004, pp. 4178-4182, Aachen, Germany.

Amro, R. et al. "Double-Sided Low-Temperature Joining Technique for Power Cycling Capability at High Temperature", Power Electronics and Applications 2005 European Conference, 2005, pp. 1-10, Dresden, Germany.

Licht, Thomas et al. "Sintering technology used for interconnection of large areas: potential and limitation for power modules", CIPS 2010—6th International Conference on Integrated Power Electronics Systems, Mar. 16-18, 2010, Nuremberg, Germany.

Guth, Karsten et al, "New assembly and interconnects beyond sintering methods", Power Conversion Intelligent Motion, May 4-6, 2010, pp. 232-237, Nuremberg, Germany.

Göbl, C. et al, "Low temperature sinter technology Die attachment for power electronic applications", CIPS 2010—6th International Conference on Integrated Power Electronics Systems, Mar. 16-18, 2010, pp. 1-5, Nuremberg, Germany.

* cited by examiner

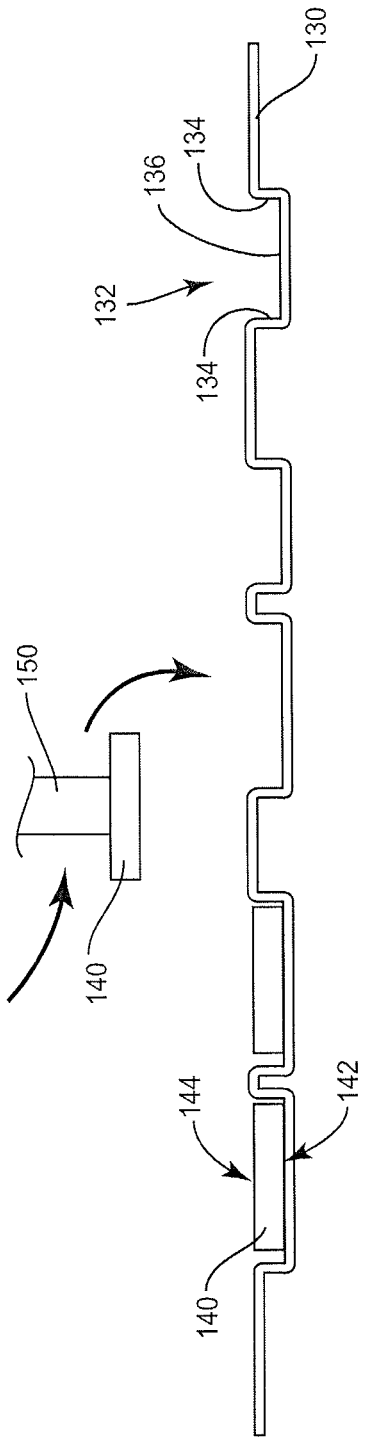
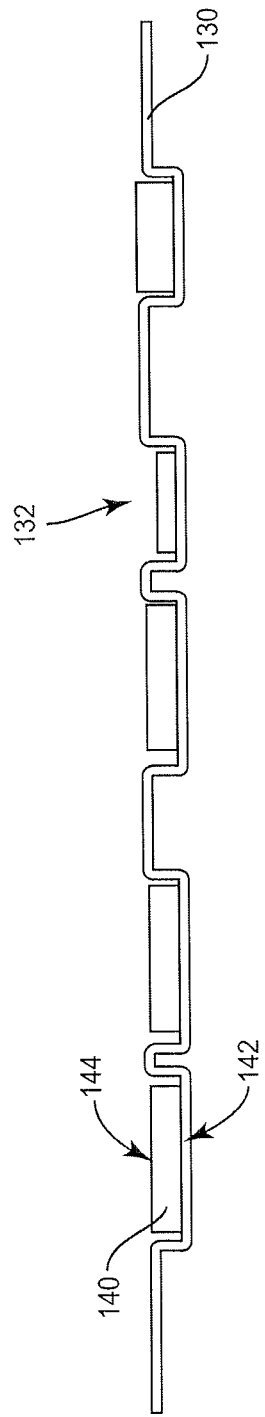

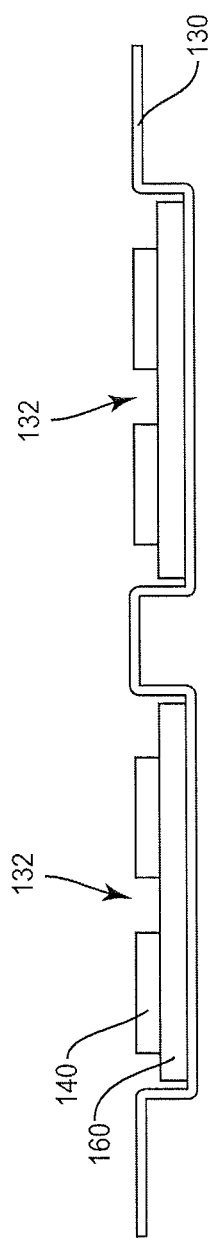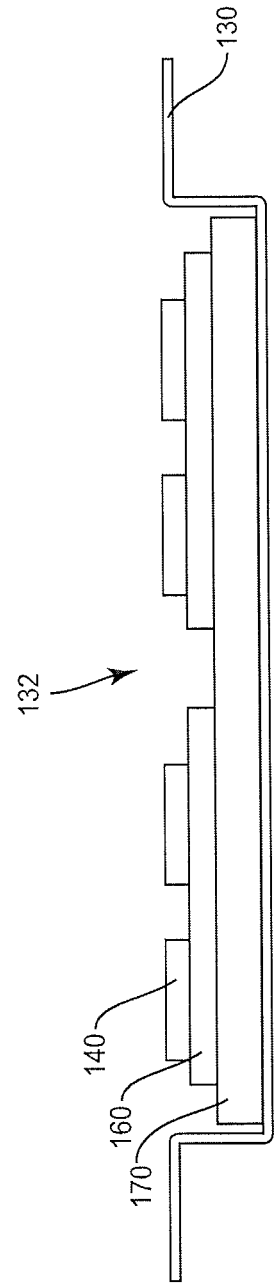

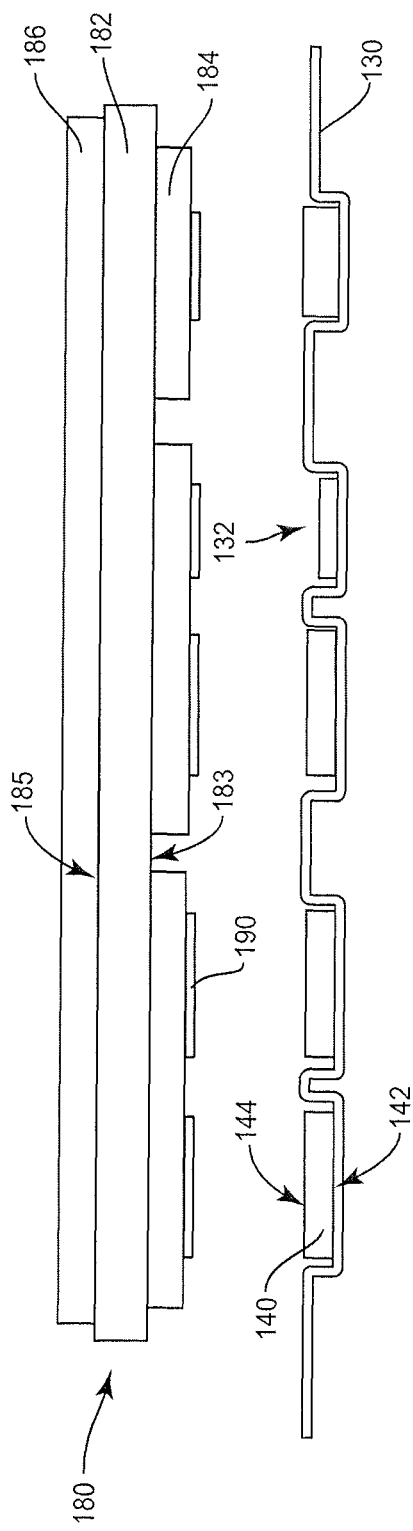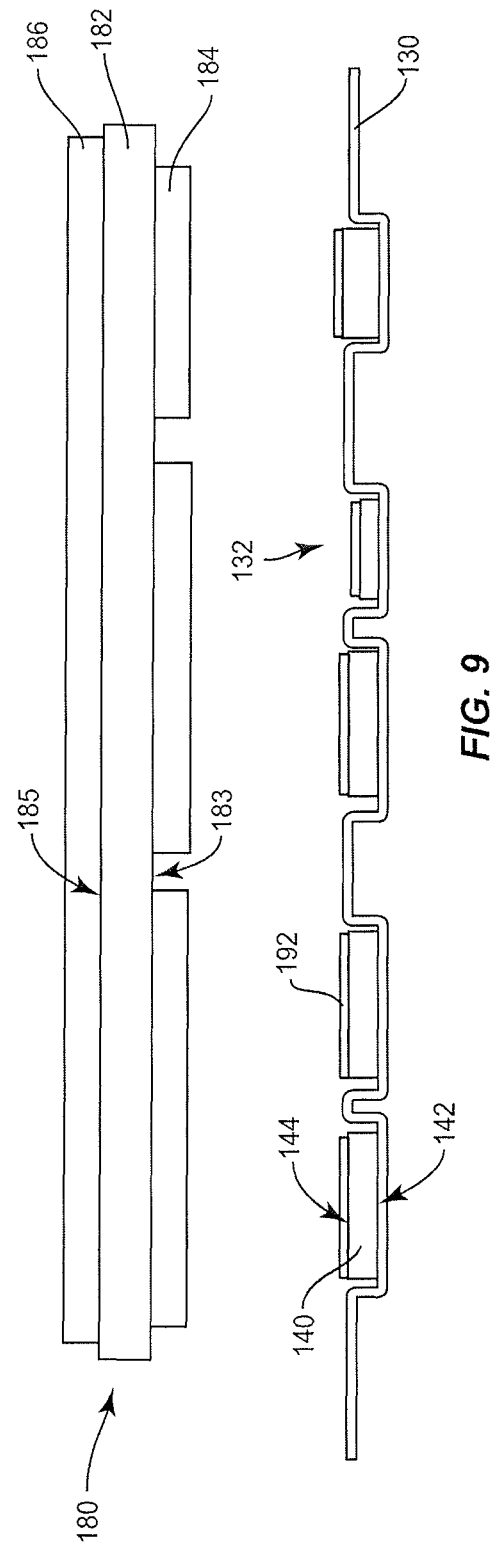

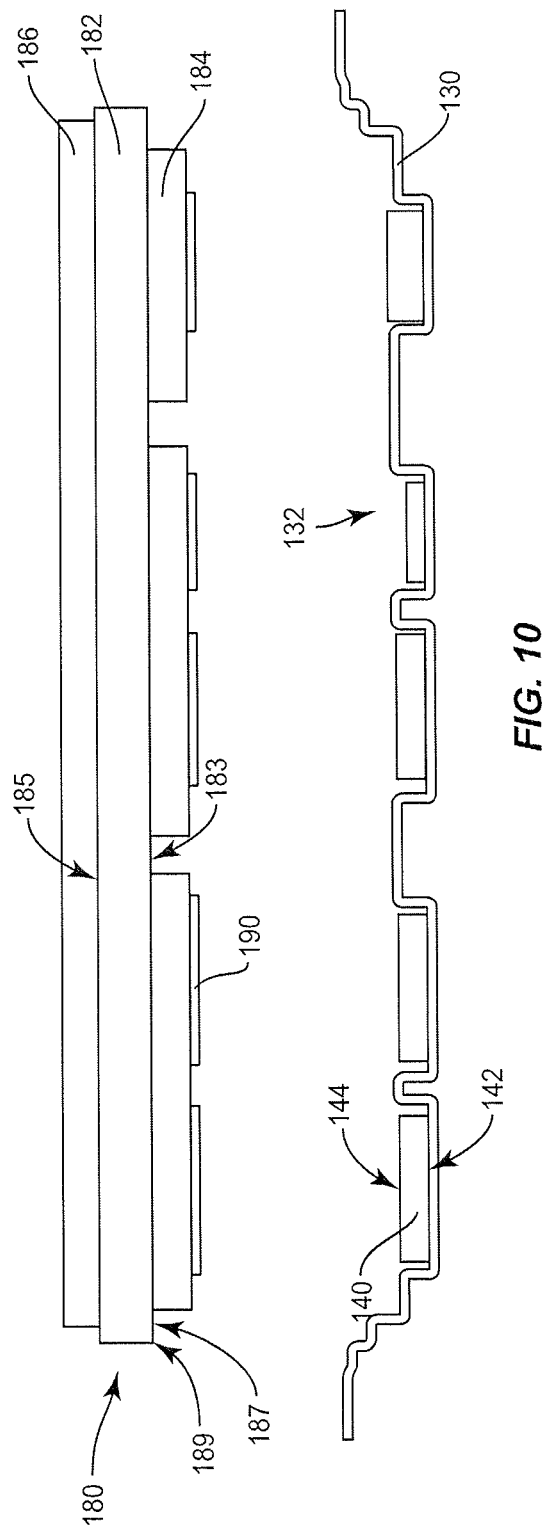

FIXING SEMICONDUCTOR DIE IN DRY AND PRESSURE SUPPORTED ASSEMBLY PROCESSES

FIELD OF TECHNOLOGY

The present application relates to assembling semiconductor die on substrates, in particular dry and pressure supported assembly processes for attaching semiconductor die to substrates.

BACKGROUND

For reliability improvement of power semiconductor modules, silver-sintering and diffusion-soldering technologies have been introduced. Both technologies can be used for die-to-substrate, substrate-to-base-plate and optionally terminal-to-die or substrate joints. Both technologies require pressure during the formation of the joint. In parallel with a pressure profile, a heating profile i.e. a temperature profile is required to set the necessary joining temperature. Die bonding tools are used for diffusion soldering which apply vertical force during die placement on heated substrates. For silvering sintering, the piece parts to be joined are placed on a heated plate and pressed by a tool with a silicone rubber interface. The silicone interface is enclosed in a tool with side walls and substrates to be joined. Under high pressure the silicone behaves like a liquid and hydrostatic pressure is achieved. Between the silicone rubber and the parts to be joined a protecting foil is typically used. The foil is deformed under high pressure and adjusts to the topology of the devices and therefore does not affect the hydrostatic pressure. Another technique involves the use of multi-die tools, where each die receives the same pressure. Again a flexible foil at the interface with the devices protects the surfaces of the devices.

For silver sintering the best joints are achieved when the silver paste, which is mixed with solvents and liquid binders, is dried and heated before die placement. Consequently the die do not adhere to the surface of the paste and can shift after placement and prior to the application of pressure. The sinter layer can be placed on the die during wafer processing. In each case the joining layer is dry and not well suited for adherence. For diffusion soldering, the substrates or die are plated with solder prior to assembly. If the soldering process occurs in a furnace or chamber the die must be placed on the substrate when the solder is below the solder melting point. Again the interface die to substrate is dry and the die do not adhere to the substrates until after placement and a temperature above the solder melting point is applied. Another possibility is to place the die into a wet paste and accepting the disadvantage in the joint. The result of such a sinter process where the die is placed in a wet paste is the formation of channels within the joint, which remain after the joining process.

SUMMARY

Described herein is a deep drawn, pre-shaped foil fixture used as a carrier of semiconductor die and a fixture for the semiconductor die. The foil fixture can withstand sintering and diffusion soldering temperatures. The foil fixture adjusts to the topology of the structures to be joined prior to attachment and seals against contamination or pressurized gas during the attachment process.

According to an embodiment of a method of manufacturing a foil fixture for use in attaching semiconductor die to a substrate, the method includes: heating a tool die having a base and a plurality of spaced apart protrusions extending from the base which define a shape of the tool die; and pressing an elastically deformable foil fixture against the tool die while the tool die is heated so that the foil fixture deforms to the shape of the tool die.

According to an embodiment of a method of assembling semiconductor die on a substrate, the method includes: providing a plurality of semiconductor die, a substrate, and an elastically deformable foil fixture preformed with one or more sunken regions having sidewalls and a bottom; placing the plurality of semiconductor die in the one or more sunken regions with a first side of the plurality of semiconductor die facing the bottom of the one or more sunken regions and a second opposing side of the plurality of semiconductor die facing away from the bottom of the one or more sunken regions; placing the substrate adjacent the second side of the plurality of semiconductor die with a joining material interposed between the substrate and the plurality of semiconductor die; and pressing together the substrate and the foil fixture with the plurality of semiconductor die placed in the one or more sunken regions at an elevated temperature and pressure via first and second pressing tool members so that the substrate is attached to the second side of the plurality of semiconductor die via the joining material.

According to an embodiment of a joining tool, the tool includes a first pressing member, a second pressing member opposing the first pressing member and a pressure chamber between the first and second pressing members. The pressure chamber is configured to receive an elastically deformable foil fixture preformed with one or more sunken regions having sidewalls and a bottom, with a plurality of semiconductor die placed in the one or more sunken regions so that a first side of the plurality of semiconductor die faces the bottom of the one or more sunken regions and a second opposing side of the plurality of semiconductor die faces away from the bottom of the one or more sunken regions, and further with a substrate disposed adjacent the second side of the plurality of semiconductor die and a joining material interposed between the substrate and the plurality of semiconductor die. The first and second pressing members are configured to press together the substrate and the foil fixture with the plurality of semiconductor die placed in the one or more sunken regions at an elevated temperature and pressure in the pressure chamber so that the substrate is attached to the second side of the plurality of semiconductor die via the joining material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4 illustrates the foil fixture of FIG. 3 during placement of semiconductor die in the preformed sunken regions.

FIG. 5 illustrates the foil fixture of FIG. 3 after being populated with semiconductor die.

FIG. 6 illustrates the foil fixture of FIG. 3 after being populated with semiconductor die on one or more support substrates.

FIG. 7 illustrates the foil fixture of FIG. 3 after being populated with semiconductor die on one or more support substrates which are on a base plate.

FIG. 8 illustrates a substrate with a sintering joining layer during alignment with the populated foil fixture of FIG. 5.

FIG. 9 illustrates a substrate with a diffusion soldering joining layer during alignment with the populated foil fixture of FIG. 5.

FIG. 10 illustrates the populated foil fixture of FIG. 5 also being preformed to fit edge and corner regions of a substrate which are devoid of semiconductor die.

DETAILED DESCRIPTION

Figure 1:
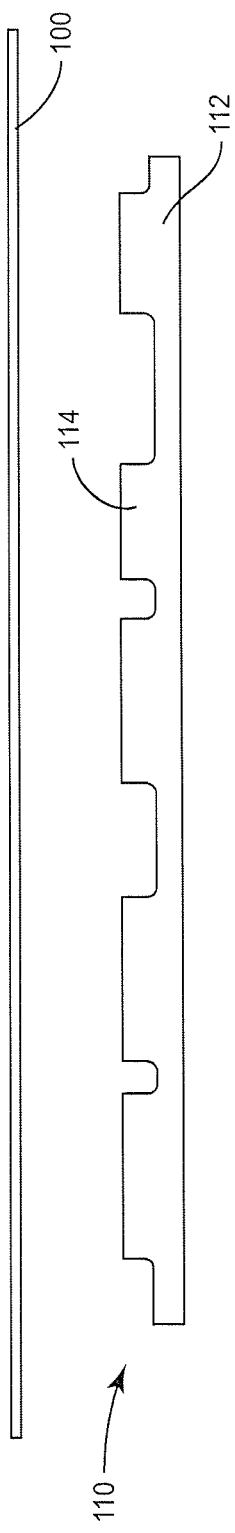
FIG. 1 illustrates an elastically deformable foil and a tool die for deforming the foil according to an embodiment.

FIG. 1 illustrates an embodiment of an elastically deformable foil 100 for protecting the surface of semiconductor die and substrates against tools used to apply pressure during the process of attaching the semiconductor die to the substrates. The foil 100 is preformed to serve as a fixture and carrier for semiconductor die. In one embodiment, the foil 100 is preformed by a deep drawing process. The deep drawing process includes providing a tool die 110 having a base 112 and a plurality of spaced apart protrusions 114 extending from the base 112 which define a shape of the tool die 110. The elastically deformable foil 100 is pressed against the tool die 110 while the tool die 110 is heated so that the foil 100 deforms to the shape of the tool die 110. The shape of the tool die 110 corresponds to the shape and spacing of a plurality of semiconductor die, one or more support substrates to be attached to the semiconductor die or a base plate to be attached to the one or more support substrates.

Figure 2:
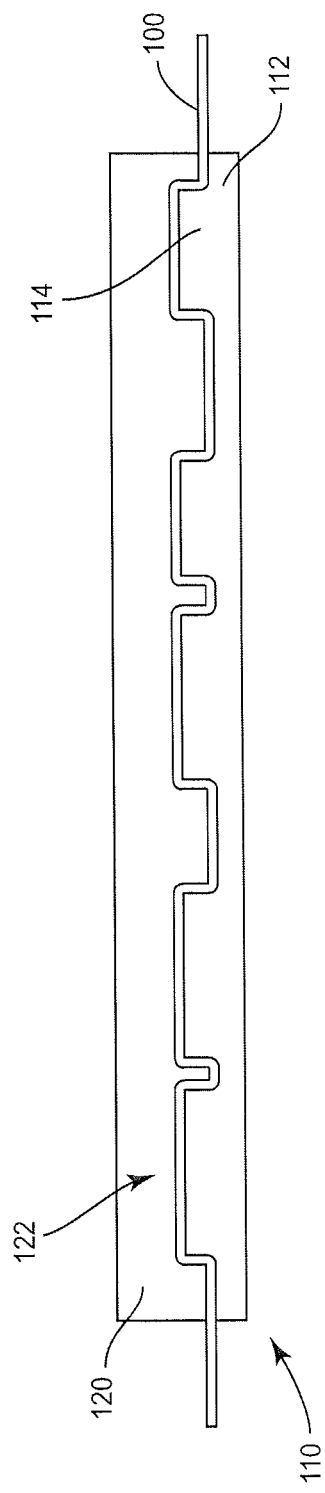
FIG. 2 illustrates the elastically deformable foil of FIG. 1 during an embodiment of a deformation process.

FIG. 2 shows one embodiment where a stamp 120 is used to press the elastically deformable foil 100 against the tool die 110 while the tool die 110 is heated. The stamp 120 can be made of a rigid material and have the opposite surface topology as the tool die 110 so that each protrusion 114 of the tool die 110 is received in a corresponding recess 122 of the stamp 120. In another embodiment, the stamp 120 can be a silicone rubber stamp used in a pressurized chamber which applies hydrostatic pressure to the foil 100 when under pressure. Still other types of stamps can be used to preform the foil 100. In one embodiment, the foil 100 is pressed against the tool die 110 at a temperature of up to 150° C. and a pressure of up to 5 bars. Other suitable temperatures and pressures may be employed to preform the foil 100.

Figure 3:
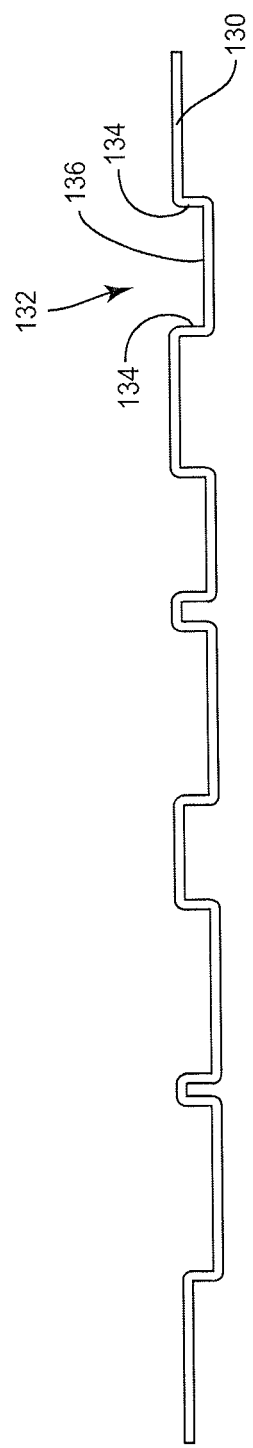
FIG. 3 illustrates an embodiment of a foil fixture with preformed sunken regions formed by the deformation process of FIG. 2.

FIG. 3 shows a foil fixture 130 produced by the drawing process described above. The foil fixture 130 is preformed with spaced apart sunken regions 132 having sidewalls 134 and a bottom 136. The sunken regions 132 have a shape and spacing corresponding to a plurality of semiconductor die, one or more support substrates to be attached to the semiconductor die or a base plate to be attached to the one or more support substrates. This way, the preformed foil fixture 130 serves as a fixture and carrier for semiconductor die, substrates and/or base plates. The preformed foil fixture 130 adjusts to the topology of the structures to be joined prior to attachment and seals against contamination or pressurized gas during the attachment process as described later herein.

The preformed foil fixture 130 can withstand sintering and diffusion soldering temperatures. In one embodiment, the preformed foil fixture 130 is a plastic foil fixture which can withstand >200° C., >230° C., >250° C., or >260° C. In one embodiment, the preformed foil fixture 130 is a PTFE (polytetrafluoroethylene) foil, a polyimide foil, a liquid crystal polymer foil or the like. Alternatively, the preformed foil fixture 130 is a non-sintered ceramic foil fixture which allows for plastic deformation. In some embodiments, the preformed foil fixture 130 has a thickness $t_F$ of between 20 µm to 500 µm, e.g. between 100 µm to 250 µm.

FIG. 4 illustrates a plurality of semiconductor die 140 during placement in the sunken regions 132 of the preformed foil fixture 130. According to this embodiment, the semiconductor die 140 are picked from a wafer (not shown) after dicing i.e. after the semiconductor die 140 are individually separated from one another e.g. via wafer sawing. The semiconductor die 140 are typically adhered to an adhesion foil fixture after dicing, with the rear side adhered to the wafer foil fixture. A pick-and-place tool 150 is used to pick-up the individual semiconductor die 140, flip the semiconductor die 140 if desired and a place the individual semiconductor die 140 into the sunken regions 132 of the preformed foil fixture 130. This way e.g., the active sides 142 of the semiconductor die 140 face downward toward the bottom 136 of the sunken regions 132 and the opposing side 144 of the semiconductor die 140 faces away from the bottom 136 of the sunken regions 132.

FIG. 5 shows the preformed foil fixture 130 after all of the semiconductor die 140 are placed in the corresponding sunken regions 132. As can be seen from FIG. 5, the preformed foil fixture 130 serves as a carrier and fixture for the semiconductor die 140. That is, the semiconductor die 140 are supported by the preformed foil fixture 130 and can be readily moved without the semiconductor die 140 moving out of position from the sunken regions 132.

FIG. 6 shows an alternative embodiment where the semiconductor die are placed on one or more support substrates 160 and the support substrate(s) 160 are received by corresponding sunken region(s) 132 of the preformed foil fixture 130. According to this embodiment, the shape of the tool die 110 corresponds to the shape and spacing of the one or more support substrates 160 to be attached to the semiconductor die 140 so that the preformed sunken region(s) 132 of the foil fixture 130 can receive the support substrate(s) 160.

FIG. 7 shows another alternative embodiment where the semiconductor die 140 are placed on the one or more support substrates 160, the support substrate(s) 160 are placed on a base plate 170 such as a metal heat sink, and the base plate 170 is received by one preformed sunken region 132 of the foil fixture 130. According to this embodiment, the shape of the tool die 110 corresponds to the shape of the base plate 170 to be attached to the support substrate(s) 160 so that the preformed sunken region 132 of the foil fixture 132 can receive the base plate 170.

FIG. 8 shows an embodiment of the preformed foil fixture 130 populated with a plurality of semiconductor die 140 in the sunken regions 132 of the foil 130, during alignment of a substrate 180 to the semiconductor die 140. The substrate 180 can include a dielectric insulation carrier 182 with a lower metallization 184 and an optional upper metallization 186. The metallizations 184, 186 are fixedly connected to the bottom side 183 and to the topside 185, respectively, of the insulation carrier 182. The insulation carrier 182 can be a flat ceramic lamina, for example. Examples of suitable ceramic materials therefore include aluminum nitride (AlN), aluminum oxide, ($Al_2O_3$), silicon nitride ($Si_3N_4$), silicon carbide (SiC), or beryllium oxide (BeO). The metallizations 184, 186 can comprise copper or a copper alloy having a high proportion of copper. The substrate 180 can be, for example, a DCB substrate (DCB=Direct Copper Bonding) or a DAB substrate (DAB=Direct Aluminum Bonding) or an AMB substrate (AMB=Active Metal Brazing).

In each case, the substrate 180 is placed on the preformed foil fixture 130, aligned to the semiconductor die positions i.e. aligned to the structure of the preformed foil fixture 130. Due to the weight of the substrate 180, the substrate 180 should not shift unintended on the foil fixture 130 and does not necessarily need to be held in place by a special tool. The foil fixture 130 ensures the semiconductor die 140 and the substrate 180 remain in place while pressed together and heated during a sintering process for attaching the components. To this end, a sintering material 190 such as silver is disposed on the lower metallization 184 of the substrate 180 according to this embodiment so that the sintering material 190 is interposed between the substrate 180 and the semiconductor die 140 after the substrate 180 is placed adjacent the semiconductor die 140. Although not shown in FIG. 8, additional sintering material can be disposed on the exposed sides 144 of the semiconductor die 140 in addition to or in place of the sintering material 190 on the substrate 180. The assembly is subsequently heated under pressure in a sintering tool according to this embodiment.

FIG. 9 shows another embodiment of the foil fixture 130 populated with a plurality of semiconductor die 140 in the preformed sunken regions 132 of the foil 130, during alignment of a substrate 180 to the semiconductor die 140. According to this embodiment, a diffusion soldering material 192 is disposed on the exposed sides 144 of the semiconductor die 140 so that the diffusion soldering material 192 is interposed between the substrate 180 and the semiconductor die 140 after the substrate 180 is placed adjacent the semiconductor die 140. Although not shown in FIG. 9, additional diffusion soldering material can be disposed on the lower metallization 184 of the substrate 180 in addition to or in place of the diffusion soldering material 192 on the semiconductor die 140. The assembly is subsequently heated under pressure in a diffusion soldering tool according to this embodiment.

FIG. 10 illustrates yet another embodiment of the foil fixture 130 populated with a plurality of semiconductor die 140 in the preformed sunken regions 132 of the foil 130, during alignment of a substrate 180 to the semiconductor die 140. According to this embodiment, the elastically deformable foil fixture 130 is also preformed to fit edge and corner regions 187, 189 of the substrate 180 which are devoid of semiconductor die. The foil fixture 130 can be held by a frame for better handling. The substrate 180 likewise may be held by a frame carrier. In each case, the joining material 190/192 interposed between the semiconductor die 140 and the substrate 180 is dried prior to the joining process.

Figure 11:
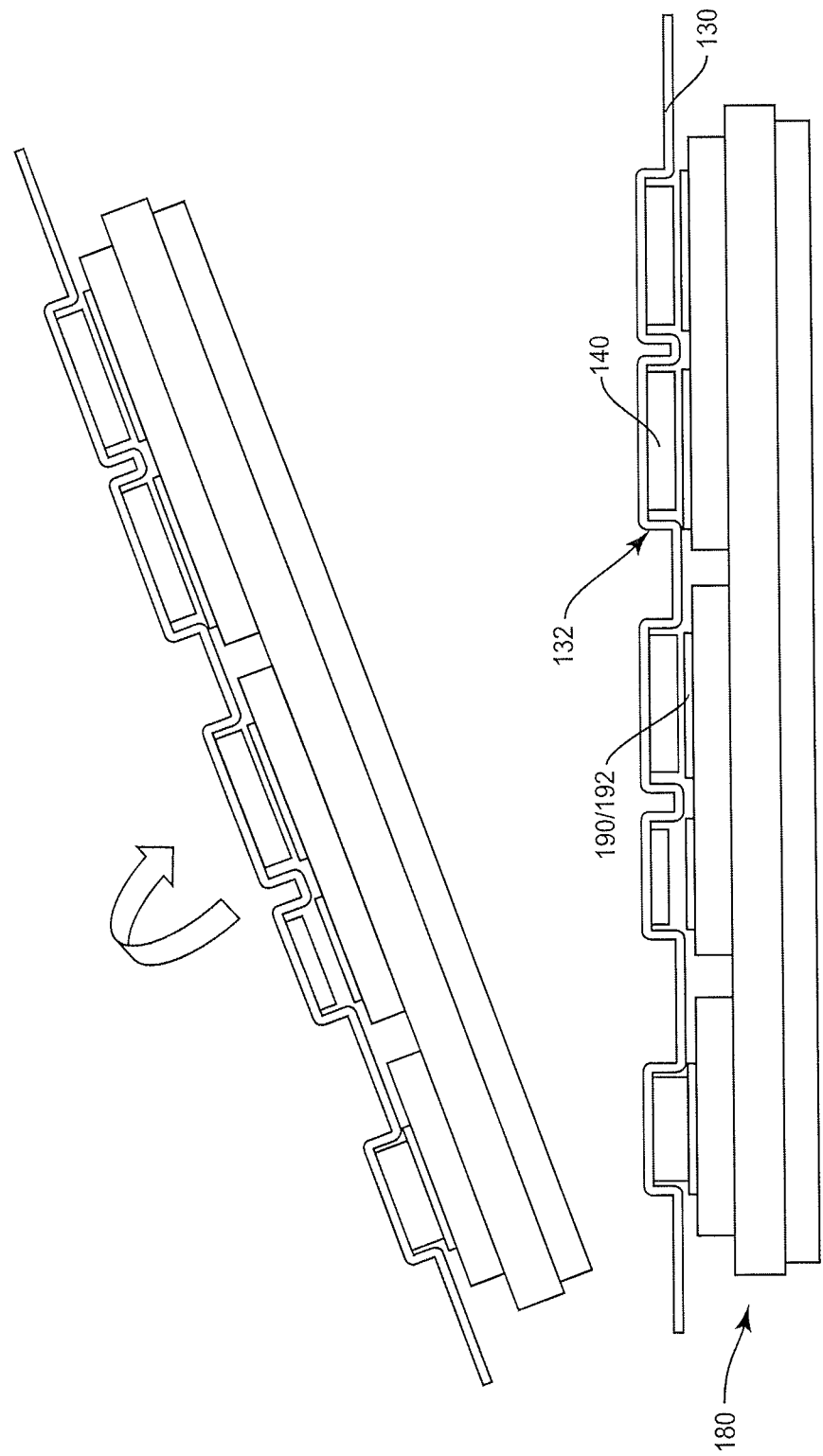
FIG. 11 illustrates the populated foil fixture and substrate assembly of FIG. 8 or 9 being flipped over.

FIG. 11 illustrates an embodiment where prior to the substrate 180 and the populated foil fixture 130 being pressed together at an elevated temperature and pressure during a joining process, the populated foil fixture 130 is clamped to the substrate 180 with the substrate 180 positioned above the populated foil fixture 130. The clamped arrangement is then flipped so that the substrate 180 is positioned below the populated foil fixture 130. One or more frames can be provided to support the populated foil fixture 130 and/or the entire assembly during this process.

Figure 12:
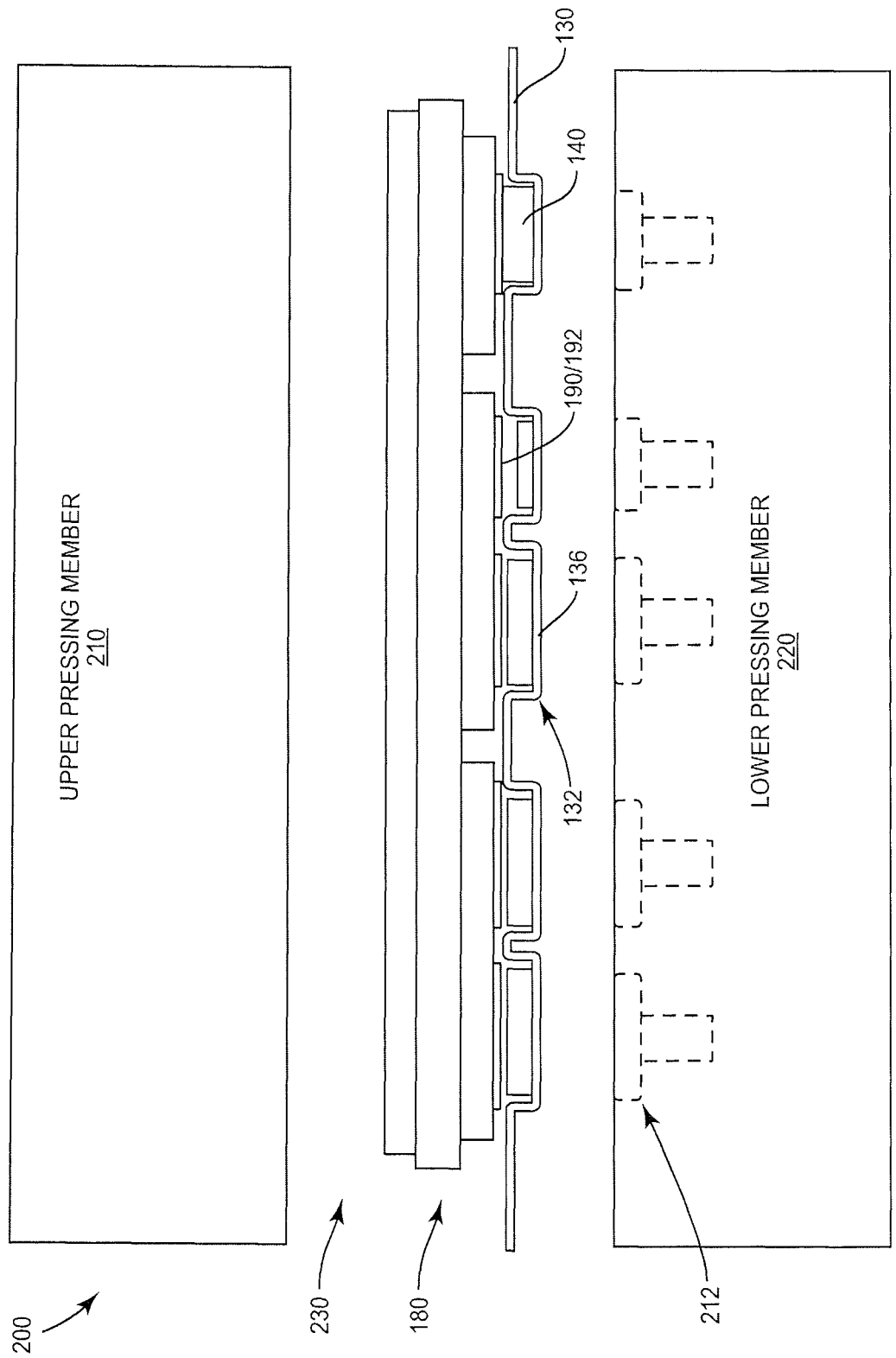
FIG. 12 illustrates the populated foil fixture and substrate assembly of FIG. 8 or 9 loaded into a joining tool according to an embodiment.

FIG. 12 illustrates an embodiment of a joining tool 200 for use with the elastically deformable preformed foil fixture 130. According to this embodiment, the joining tool 200 includes an upper pressing member 210, a lower pressing member 220 opposing the upper pressing member 210 and a pressure chamber 230 between the upper and lower pressing members 210, 220. The pressure chamber 230 receives the elastically deformable foil fixture 130 preformed with sunken region(s) 132. The preformed foil fixture 130 can be populated with a plurality of semiconductor die 140 in the sunken regions 132 so that a first (lower) side 142 of the semiconductor die 140 face the bottom 136 of the sunken regions 132 and a second (upper) opposing side 144 of the semiconductor die 140 faces away from the bottom 136 of the sunken regions 132, and further with a substrate 180 disposed adjacent the upper side 144 of the semiconductor die 140 and a joining material 190/192 interposed between the substrate 180 and the semiconductor die 140.

In FIG. 12, only semiconductor die 140 are shown populating the preformed sunken regions 132 of the foil fixture 130 and the sunken regions 132 therefore have a shape and spacing corresponding to the semiconductor die 140. However, the sunken regions 132 can instead have a shape and spacing corresponding to one or more support substrates 160 adjacent the lower side 142 of the semiconductor die 140 if present (e.g. as shown in FIG. 6) or a base plate 170 adjacent the one or more support substrates 160 also if present (e.g. as shown in FIG. 7), as previously described herein.

In each case, the upper and lower pressing members 210, 220 press together the substrate 180 and the populated foil fixture 130 at an elevated temperature and pressure in the pressure chamber 230 so that the substrate 180 is attached to the second (upper) side 144 of the semiconductor die 140 via the joining material 190/192. In one embodiment, the joining material is a sintering material 190 and the joining tool is a sintering tool. In another embodiment, the joining material is a soldering material 192 and the joining tool is a diffusion soldering tool. In each case, the preformed foil fixture 130 withstands the joining temperature and pressure.

In one embodiment, the upper or lower pressing tool member 210/220 includes a silicone pad which exerts hydrostatic pressure for pressing together the substrate 180 and the populated foil fixture 130. The lower pressing tool member 220 can include a plurality of plungers 212 for pressing the bottom 136 of the preformed sunken regions 132 of the foil fixture 130 against the first (lower) sides 142 of the semiconductor die 140.

Figure 13:
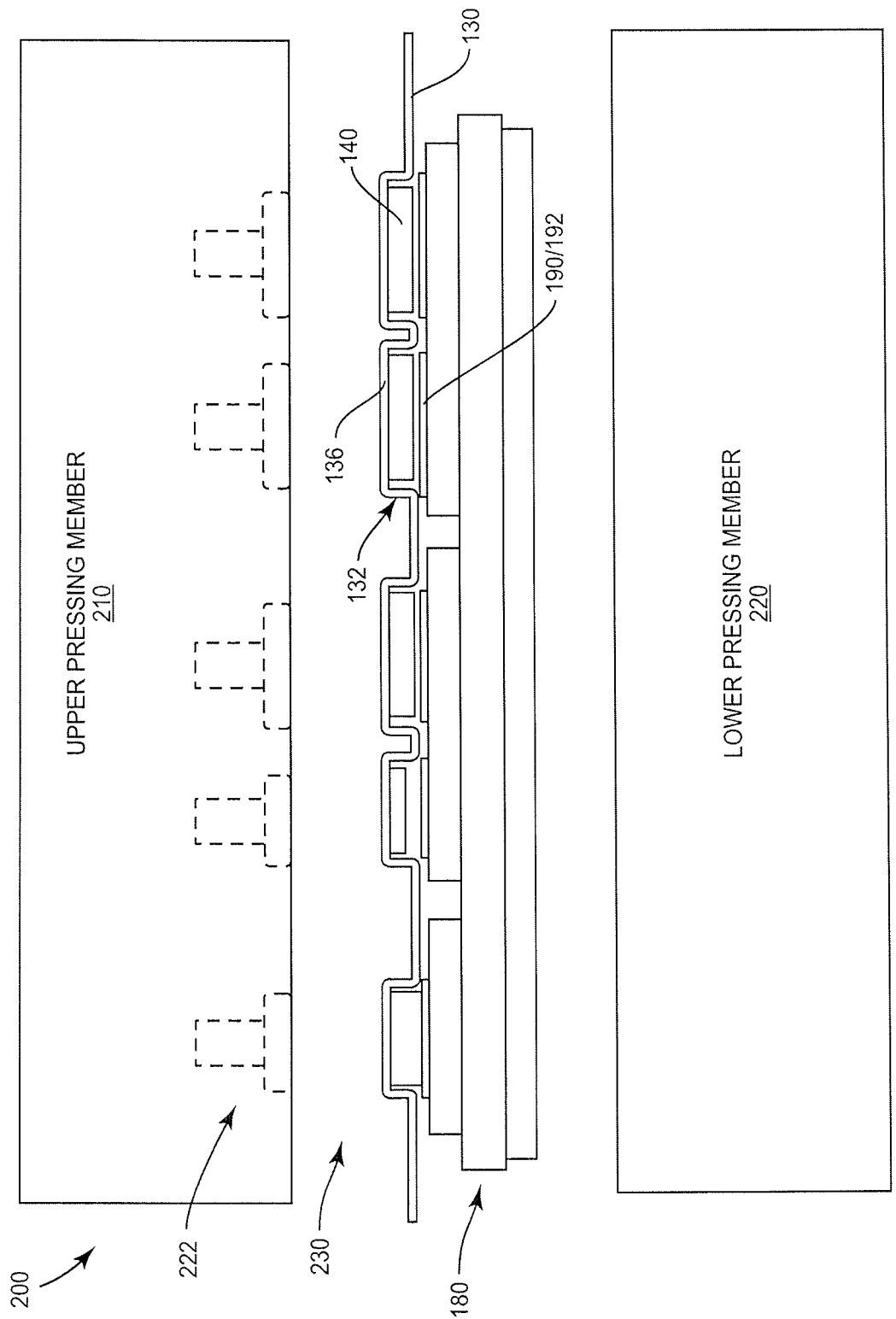
FIG. 13 illustrates the populated foil fixture and substrate assembly of FIG. 8 or 9 loaded into a joining tool according to another embodiment.

FIG. 13 illustrates another embodiment of the joining tool 200 for use with the elastically deformable preformed foil fixture 130. The embodiment of FIG. 13 is similar to the one shown in FIG. 12, except the orientation of the substrate/foil assembly is flipped so that the substrate 180 is positioned closer to the lower pressing member 220 of the joining tool 200 and the populated foil fixture 130 is positioned closer to the upper pressing member 210. In the case, the upper pressing member 210 can include a plurality of plungers 222 for pressing the bottom 136 of the preformed sunken regions 132 of the foil fixture 130 against the first (lower) sides 142 of the semiconductor die 140.

In each case, the elastically deformable foil 100 can be preformed in the joining tool 200 according to some embodiments instead of by a separate tool. For example, the tool die 110 previously described herein can be placed or otherwise contained in the pressure chamber 230 of the joining tool 200 or in a different chamber of the tool 200. According to these embodiments, the joining tool 200 heats the tool die 110 and presses the elastically deformable foil 100 against the heated tool die to form the foil fixture 130 with the preformed sunken region(s) 132. The foil fixture 130 is then populated with components and attached to a substrate 180 under pressure and temperature within the pressure chamber 130 via the upper and lower pressing members 210, 220 as previously described herein. Alternatively a separate tool which includes the tool die 110 can be used to preform the elastically deformable foil 100.

Figure 14:
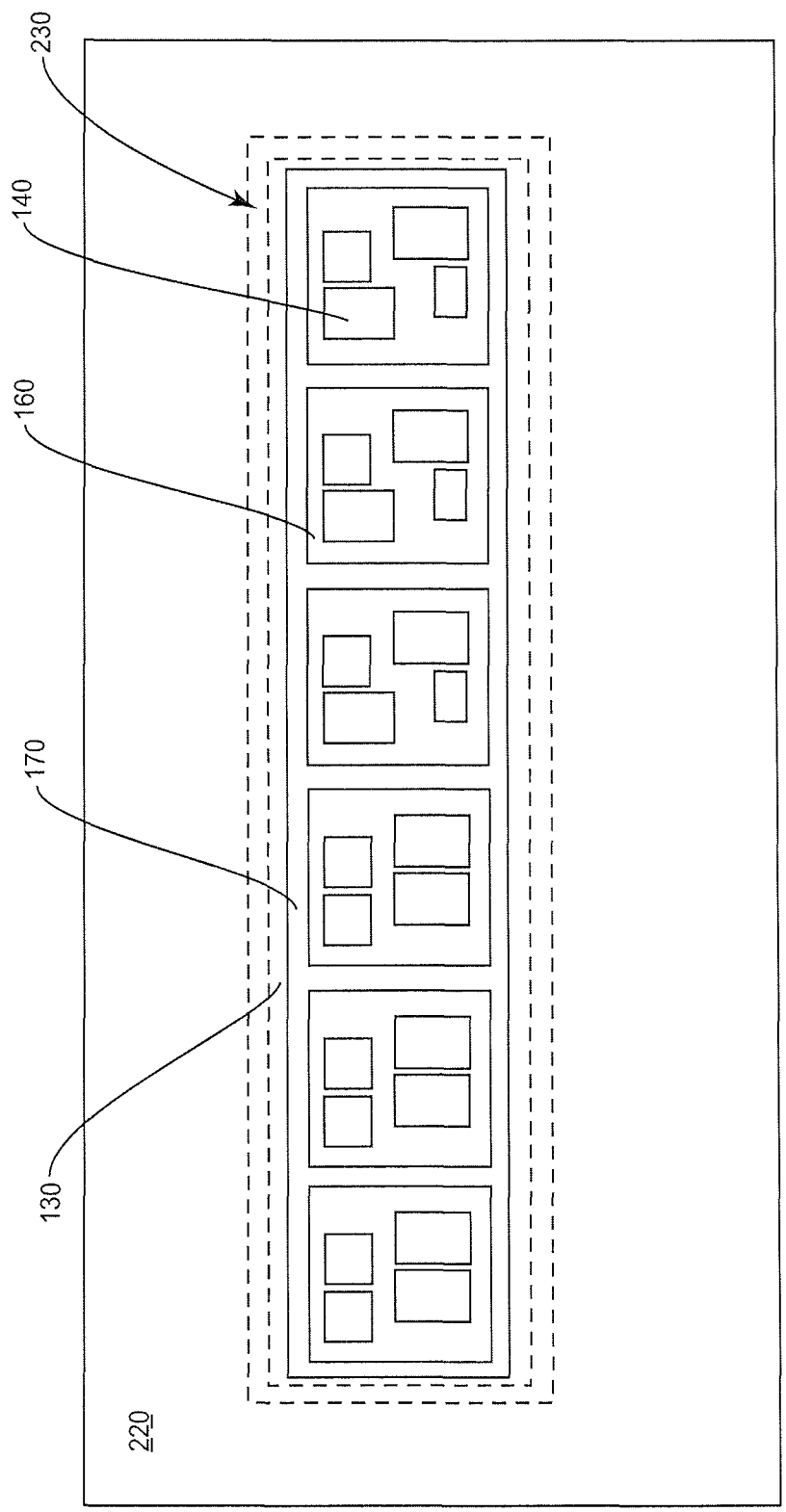
FIG. 14 illustrates the foil fixture of FIG. 3 loaded into a joining tool and populated with semiconductor die on one or more support substrates which are on a base plate according to an embodiment.

FIG. 14 illustrates a top down plan view of the joining tool 200 with the populated preformed foil fixture 130 placed in the pressure chamber 230 of the tool 200. The upper pressing member 210 is out of view in FIG. 14. According to this embodiment, the foil fixture 130 is preformed with one sunken region 132 shaped to receive a base plate 170 on which several support substrates 160 are positioned. One or more semiconductor die 140 are placed on each support substrate 160 e.g. as shown in the cross-sectional view of FIG. 8. An additional substrate 180 is subsequently attached to the upper (exposed) sides 144 of the semiconductor die 140 at elevated pressure and temperature in the pressure chamber 230 via the upper and lower pressing members 210, 220 as previously described herein. The optional base plate 170 may be excluded, in which case the foil fixture 130 is preformed with sunken region(s) 132 shaped to receive the support substrate(s) e.g. as shown in the cross-sectional view of FIG. 7.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of assembling semiconductor die on a substrate, comprising:
providing a plurality of semiconductor die, a substrate, and an elastically deformable foil fixture preformed with one or more sunken regions having sidewalls and a bottom;
placing the plurality of semiconductor die in the one or more sunken regions to populate the foil fixture, with a first side of the plurality of semiconductor die facing the bottom of the one or more sunken regions and a second opposing side of the plurality of semiconductor die facing away from the bottom of the one or more sunken regions;
placing the substrate adjacent the second side of the plurality of semiconductor die with a joining material interposed between the substrate and the plurality of semiconductor die; and
pressing together the substrate and the populated foil fixture at an elevated temperature and pressure via first and second pressing tool members so that the substrate is attached to the second side of the plurality of semiconductor die via the joining material,
wherein end regions of the populated foil fixture form a seal between the first and second pressing tool members while the substrate and the populated foil fixture are pressed together at an elevated temperature and pressure.

2. The method of claim 1, wherein prior to pressing together the substrate and the populated foil fixture at an elevated temperature and pressure the method further comprises:
clamping the populated foil fixture to the substrate so that the substrate is positioned above the populated foil fixture; and
flipping the clamped arrangement so that the substrate is positioned below the populated foil fixture.

3. The method of claim 1, wherein the foil fixture is preformed to fit edge and corner regions of the substrate which are devoid of semiconductor die.

4. The method of claim 1, wherein the joining material is a sintering material and the first and second pressing tool members are part of a sintering tool.

5. The method of claim 1, wherein the joining material is a soldering material and the first and second pressing tool members are part of a diffusion soldering tool.

6. The method of claim 1, wherein the first or second pressing tool member includes a silicone pad which exerts hydrostatic pressure for pressing together the substrate and the populated foil fixture.

7. The method of claim 1, wherein the pressing tool member adjacent the populated foil fixture includes a plurality of plungers for pressing the bottom of the one or more sunken regions of the foil fixture against the first side of the plurality of semiconductor die.

8. The method of claim 1, wherein the one or more sunken regions of the foil fixture have a shape and spacing corresponding to the plurality of semiconductor die, one or more support substrates disposed between the first side of the plurality of semiconductor die and the bottom of the one or more sunken regions or a base plate disposed between the one or more support substrates and the bottom of the one or more sunken regions.

9. The method of claim 1, wherein prior to pressing together the substrate and the populated foil fixture at an elevated temperature and pressure the method further comprises:
heating a tool die having a base and a plurality of spaced apart protrusions extending from the base which correspond to the shape and spacing of the plurality of semiconductor die, one or more support substrates disposed between the first side of the plurality of semiconductor die and the bottom of the one or more sunken regions or a base plate disposed between the one or more support substrates and the bottom of the one or more sunken regions; and
pressing the foil fixture against the tool die while the tool die is heated to preform the foil fixture.

10. A method of assembling semiconductor die on a substrate, comprising:
- providing a plurality of semiconductor die, a substrate, and an elastically deformable foil fixture preformed with one or more sunken regions having sidewalls and a bottom;
- placing the plurality of semiconductor die in the one or more sunken regions to populate the foil fixture, with a first side of the plurality of semiconductor die facing the bottom of the one or more sunken regions and a second opposing side of the plurality of semiconductor die facing away from the bottom of the one or more sunken regions;
- placing the substrate adjacent the second side of the plurality of semiconductor die with a joining material interposed between the substrate and the plurality of semiconductor die; and
- pressing together the substrate and the populated foil fixture at an elevated temperature and pressure via first and second pressing tool members so that the substrate is attached to the second side of the plurality of semiconductor die via the joining material,
- wherein the pressing tool member adjacent the populated foil fixture includes a plurality of plungers for pressing the bottom of the one or more sunken regions of the foil fixture against the first side of the plurality of semiconductor die.

11. A method of assembling semiconductor die on a substrate, comprising:
- providing a plurality of semiconductor die, a substrate, and an elastically deformable foil fixture preformed with one or more sunken regions having sidewalls and a bottom;
- placing the plurality of semiconductor die in the one or more sunken regions to populate the foil fixture, with a first side of the plurality of semiconductor die facing the bottom of the one or more sunken regions and a second opposing side of the plurality of semiconductor die facing away from the bottom of the one or more sunken regions;
- placing the substrate adjacent the second side of the plurality of semiconductor die with a joining material interposed between the substrate and the plurality of semiconductor die; and
- pressing together the substrate and the populated foil fixture at an elevated temperature and pressure via first and second pressing tool members so that the substrate is attached to the second side of the plurality of semiconductor die via the joining material,
- wherein prior to pressing together the substrate and the populated foil fixture at an elevated temperature and pressure, the method further comprises:
- heating a tool die having a base and a plurality of spaced apart protrusions extending from the base which correspond to the shape and spacing of the plurality of semiconductor die, one or more support substrates disposed between the first side of the plurality of semiconductor die and the bottom of the one or more sunken regions or a base plate disposed between the one or more support substrates and the bottom of the one or more sunken regions; and
- pressing the foil fixture against the tool die while the tool die is heated to preform the foil fixture.

\* \* \* \* \*